United States Patent [19]

Takahashi et al.

[11] Patent Number: 4,805,110
[45] Date of Patent: Feb. 14, 1989

[54] CIRCUIT ELEMENT MOUNTING SYSTEM AND METHOD

[75] Inventors: Tetsuo Takahashi; Shinichi Araya, both of Tokyo, Japan

[73] Assignee: TDK Corporation, Japan

[21] Appl. No.: 944,251

[22] Filed: Dec. 19, 1986

[30] Foreign Application Priority Data

Dec. 19, 1985 [JP] Japan .................. 60-284325

[51] Int. Cl.⁴ .................. G06F 15/46; B23P 19/04
[52] U.S. Cl. .................... 364/468; 29/703; 29/709; 29/741; 364/491
[58] Field of Search .......... 364/468, 488–491, 364/513, 191–193; 29/701, 703, 709, 721, 729, 739, 740, 741, 831–835

[56] References Cited

U.S. PATENT DOCUMENTS

| | | | |
|---|---|---|---|
| 4,295,198 | 10/1981 | Copeland et al. | 364/491 X |
| 4,598,459 | 7/1986 | Klink et al. | 29/703 X |
| 4,628,464 | 12/1986 | McConnell | 364/513 |
| 4,649,497 | 3/1987 | Carlson et al | 364/491 |
| 4,653,664 | 3/1987 | Hineno | 29/740 X |
| 4,706,187 | 11/1987 | Arai et al.29 | 29/740 X |

FOREIGN PATENT DOCUMENTS

| | | |
|---|---|---|
| 2009636 | 6/1979 | United Kingdom . |
| 2045117 | 10/1980 | United Kingdom . |
| 2091138 | 7/1982 | United Kingdom . |
| 2120583 | 12/1983 | United Kingdom . |
| 2131331 | 6/1984 | United Kingdom . |
| 2166372 | 5/1986 | United Kingdom . |
| 2174932 | 11/1986 | United Kingdom . |
| WO8403602 | 9/1984 | World Int. Prop. O. . |

Primary Examiner—Joseph Ruggiero
Attorney, Agent, or Firm—Steinberg & Raskin

[57] ABSTRACT

A circuit element mounting system and method capable of utilizing data from a CAD device for mounting a circuit element on a printed circuit board to permit mounting in high density or concentration. The system and method include a mounting head for holding a circuit element thereon and mounting it on a printed circuit board. Also, the system and method include controlling moving of the mounting head to a predetermined position on the printed circuit board, depending upon circuit element mounting data input thereto, to thereby cause the mounting head to mount the circuit element on the printed circuit board in a correct manner.

11 Claims, 3 Drawing Sheets

CIRCUIT ELEMENT MOUNTING SYSTEM AND METHOD

BACKGROUND OF THE INVENTION

This invention relates to a circuit element mounting system, and more particularly to a system which is adapted to control a circuit element mounting head by means of circuit element mounting data fed from a computer aided design device without modifying the data to efficiently mount circuit elements on a substrate.

Conventionally, the mounting of circuit elements such as a capacitor, a resistor, a transistor and the like on a substrate or printed circuit board has been carried out according to a mesh method. More particularly, the mesh method superposes, on a printed circuit board, a net of meshes corresponding to intervals of pins of an IC to mount circuit elements on intersections in the net. Unfortunately, the mesh method has a disadvantage that useless spaces are significantly produced on the printed circuit board because the circuit elements are mounted on only the intersections, resulting in a failure to mount in high density or concentration.

Also, in the conventional mounting operation, a step of automatically designing, by means of a computer aided design device (hereinafter referred to as "CAD device"), a printed circuit or an arrangement of circuit elements, conductor patterns and the like on a printed circuit board depending upon circuit-forming conditions such as area of the printed circuit board, types of circuit elements, the number of circuit elements and the like according to a circuit diagram, has been practiced separately from a step of mounting, by means of an automatic mounting apparatus, the circuit elements on the printed circuit board formed with the conductor patterns, so that data obtained from the CAD device was not substantially utilized for the mounting.

SUMMARY OF THE INVENTION

Accordingly, it would be highly desirable to develop a circuit element mounting system which is capable of utilizing data from a CAD device for the mounting of circuit elements on a printed circuit board as well as the design of a printed circuit.

Accordingly, it is an object of the present invention to provide a method for mounting a circuit element on a printed circuit board which is capable of utilizing data from a CAD device for the mounting as well as the design of a printed circuit to accomplish the mounting in high density.

It is another object of the present invention to provide a circuit element mounting system which is capable of utilizing data from a CAD not only for the design of a printed circuit but also for the mounting, to thereby accomplish the mounting in high density or concentration.

It is further object of the present invention to provide a circuit element mounting system and method which are capable of carrying out the mounting of a circuit element on a printed circuit board according to a random procedure.

It is still another object of the present invention to provide a circuit element mounting system and method which are capable of effectively eliminating error in the mounting of a circuit element on a printed circuit board.

It is yet another object of the present invention to provide a circuit element mounting system and method which are capable of accomplishing the mounting of a circuit element on a printed circuit board in ultra-high density or concentration.

It is still a further object of the present invention to provide a circuit element mounting system and method which are capable of accomplishing the above-noted objects with both a simple structure and facilitated operational steps.

Other objects and advantages of the present invention will be apparent from the following description of the present invention.

Briefly speaking, in accordance with the present invention, a method for mounting a circuit element on a printed circuit board is provided. In the method, a mounting head holding a circuit element thereon is moved to a predetermined position on a positioned printed circuit board depending upon circuit element mounting data supplied thereto from a CAD device, and then the circuit element is mounted on the predetermined position on the printed circuit board depending upon the data. The data generated from the CAD device may include a circuit element mounting position indicated by X and Y coordinates, a circuit element mounting posture indicated by a rotation angle $\theta$, configuration and dimensions of a circuit element and the like.

In accordance with the present invention, a circuit element mounting system is also provided. The system includes a mounting device, which includes a mounting head for holding a circuit element thereon and mounting it on a printed circuit board. The system also includes a control system for controlling operation of moving the mounting head to a predetermined position on the printed circuit board, depending upon circuit element mounting data input thereto, to cause the mounting head to mount the circuit element on the printed circuit board in a predetermined manner.

The invention accordingly comprises the steps and the relation of one or more such steps with respect to each of the others, and the system embodying features of construction, combinations of elements, and arrangements of parts which are adapted to effect such steps, as exemplified in the following detailed disclosure.

BRIEF DESCRIPTION OF THE DRAWINGS

For a fuller understanding of the invention, reference is made to the following description taken in connection with the accompanying drawings, in which.

DESCRIPTION OF THE PREFERRED EMBODIMENTS

A circuit element mounting system according to the present invention will now be described below with reference to the accompanying drawings.

Figure 1:
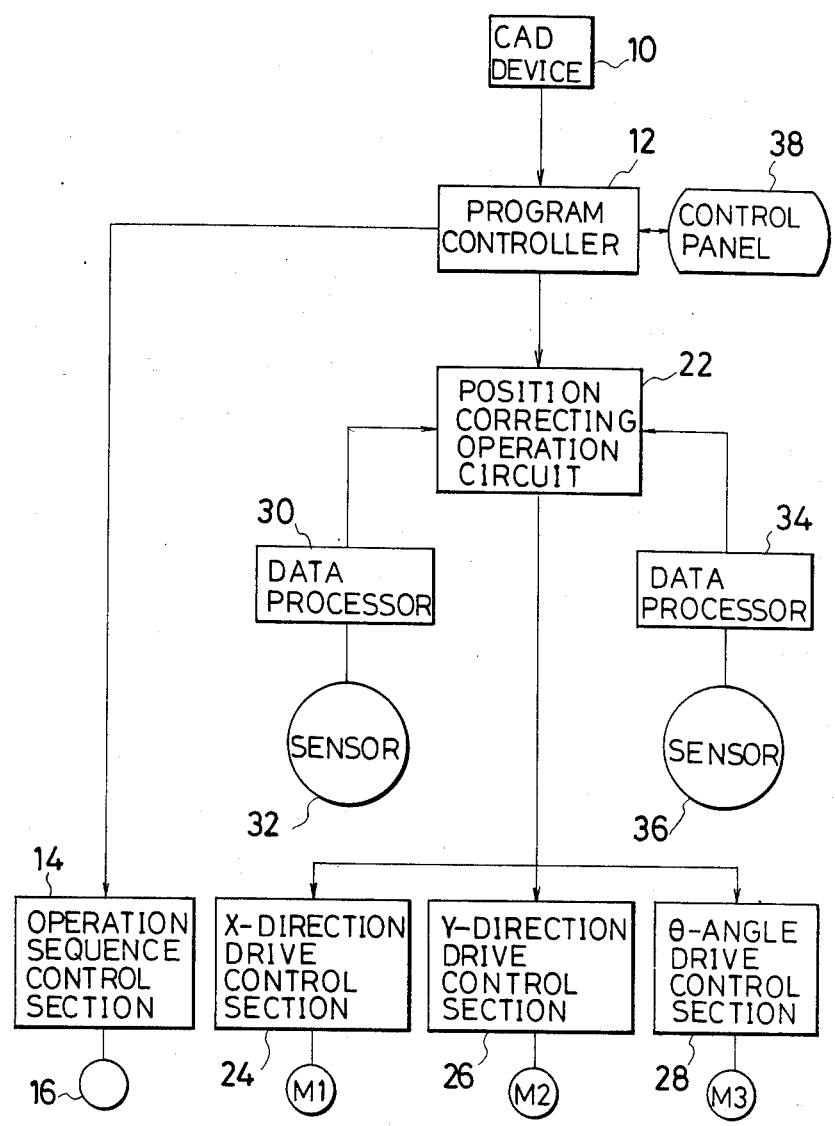
FIG. 1 is a block diagram showing a control system employed in an embodiment of a circuit element mounting system according to the present invention.

FIG. 1 shows an example of a control system which may be employed in a circuit element mounting system according to the present invention. The control system illustrated in FIG. 1 includes a CAD device 10 which has circuit forming conditions determined on the basis of predetermined circuit forming scheme input thereinto, so that it may function to generate circuit element mounting data for automatically setting the mounting position and posture of a circuit element on a substrate such as a printed circuit board. Such conditions include, for example, an area of a printed circuit board, types of circuit elements, the number of circuit elements and the like.

The CAD device 10 is electrically connected to a program controller 12 so that the circuit element mounting data generated from the CAD device 10 may be supplied to the program controller 12. The data includes, for example, a circuit element mounting position represented by means of X and Y coordinates, and a circuit element mounting posture represented by means of a rotation angle $\theta$, configuration and dimensions of a circuit element, and the like. The rotation angle $\theta$ may be indicated as an angle of rotation from a reference posture obtained, for example, when a circuit element is mounted on a printed circuit board in a manner to be parallel to a long side of the circuit board. The program controller 12, the above-described data having been supplied thereto from the CAD device 10, generates, according to order of mounting of circuit elements, positional data such as, for example, values of X and Y coordinates of each circuit element mounting position, a value of the rotation angle of each circuit element, and the like.

Figure 2:
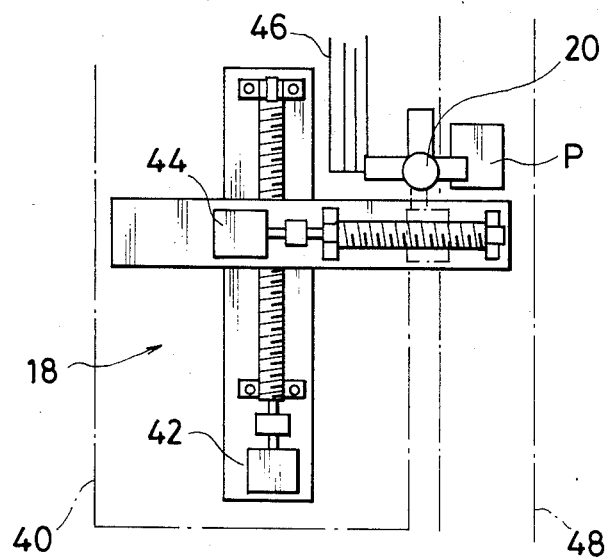
FIG. 2 is a schematic plan view showing a mounting unit of the present invention.
Figure 3:
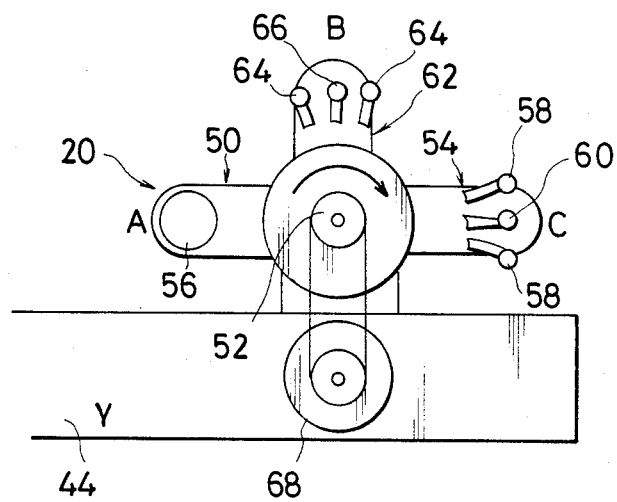
FIG. 3 is a schematic plan view showing a mounting head of the present invention.

The program controller 12 is then connected to an operation sequence control section 14 which serves to control an operation sequence of a drive mechanism 16 which is associated with a mounting unit 18 shown in FIG. 2 and a mounting head 20 shown in FIG. 3 and the like, so that the positional data generated from the program controller 12 may be supplied to the operation sequence control section 14. The drive mechanism 16 includes, for example, a cylinder, a rotating shaft and the like. Also, the program controller 12 is connected to a position correcting operation circuit 22 which is then connected to an X-direction drive control section 24, a Y-direction drive control section 26 and a $\theta$-angle drive control section 28 which are provided in the mounting unit 18 and serve to control motors M1, M2 and M3 for driving an X-direction drive shaft 42, a Y-direction drive shaft 44 and a $\theta$-angle drive shaft 56 of the mounting unit 18, respectively, so that the data generated from the program controller 12 may be also supplied through the position correcting operating circuit 22 to the control sections 24, 26 and 28.

The control system shown in FIG. 1 also includes a substrate position reading section which is connected to the position correcting operation circuit 22. In the illustrated embodiment, the substrate position reading section comprises a data processor 30 connected to the circuit 22 and an optical sensor 32 connected to the data processor 30. The optical sensor 32 acts to read a position on a printed circuit board. The data processor 30 is adapted to judge, using data read by the sensor 32, whether a substrate or printed circuit board is provided at a circuit element mounting position thereon with a place or space sufficient for mounting a circuit element. The judgement may be carried out by picture processing of the data, or the like. The judgement is supplied to the position correcting operation circuit 22.

Further, the control system of FIG. 1 includes a circuit element position reading section which is also connected to the position correcting operation circuit 22 and, in the illustrated embodiment, comprises a data processor 34 connected to the circuit 22 and an optical sensor 36 connected to the data processor 34. The optical sensor 36 acts to detect a state of a circuit element suctionally held on the mounting head 20. The data processor 34 is adapted to carry out the processing of data read by the sensor 36, by picture processing or the like. Output of the data processor is then supplied to the position correcting operation circuit 22.

The position correcting operation circuit 22 functions to judge necessity of correcting the positional data supplied from the program controller 12 thereto, in view of the data supplied from the substrate position reading section and circuit element position reading section and to correct the positional data if any correction of the data is required. The positional data or corrected data is then supplied to at least one of the X-direction drive control section 24, the Y-direction drive control section 26 and the $\theta$-angle drive control section 28.

In FIG. 1, reference numeral 38 designates a control panel for operating the program controller 12.

The mounting unit 18, shown in FIG. 2, includes an X Y table mounted on a base 40 and provided thereon with an X-direction drive section or shaft 42 and a Y-direction drive section or shaft 44, and the mounting head 20 arranged on the X-Y table. Adjacent to the mounting unit 18, a circuit element feed section 46 is arranged which includes a parts feeder, a tape feeder, a magazine and the like. Also, along the base 40 of the mounting unit 18, a substrate carrier section 48 is arranged which serves to feed printed circuit boards P to the mounting unit 18 in order and to position each of them at a location at which a circuit element is to be mounted thereon.

The mounting head 20, in the illustrated embodiment, is adapted to have a function capable of reading positions of both a circuit element and a printed circuit board. More particularly, as shown in FIG. 3, the mounting head 20 includes circuit element holding means 50 which are adapted to hold a circuit element thereon by suction and are intermittently rotated by an intermittent rotating shaft 52, and a substrate position reader 54 which constitutes the optical sensor 32 shown in FIG. 1 and is also rotated by the rotating shaft 52.

The circuit element holding means 50 include an angle adjusting shaft 56 for adjusting an angle at which a circuit element is to be mounted on a printed circuit board and which is intermittently rotated by the intermittent rotating shaft 52. The holding means 50 are adapted to hold a circuit element thereon by suction at position A and to mount it on a printed circuit board at position C.

The substrate position reading means 54 (or sensor 32) comprise an illumination 58 and a sensor head 60 and are adapted to be intermittently rotated by the rotating shaft 52 in advance of the circuit element holding means 50 to read a circuit element mounting position on a printed circuit board at position C.

The mounting head 20 also includes circuit element position reading means 62 which constitute the optical sensor 36 shown in FIG. 1 and are fixed at position B. The circuit element position reading means 62 comprise an illumination 64 and a sensor head 66 and are adapted to read a circuit element holding state of the circuit element holding means 50 rotated to position B.

Intermittent rotation of the rotating shaft 52 is carried out by means of an index motor 68.

The manner of operation of the circuit element control system constructed as described above will now be described below with reference to FIGS. 1 to 4.

Data on, for example, a circuit element mounting position represented by means of X and Y coordinates and a circuit element mounting posture represented by means of a rotation angle θ, configuration and dimensions of a circuit element, and the like, which is generated from the CAD device 10, is supplied to the program controller 12. The program controller, then generates positional data such as values of the X and Y coordinates of the circuit element mounting position and a value of the rotation angle θ and the like based on the data supplied from the CAD device 10 thereto, depending upon a type of a circuit element to be mounted. The so-generated positional data is then supplied to the mounting unit 18.

Figure 4:
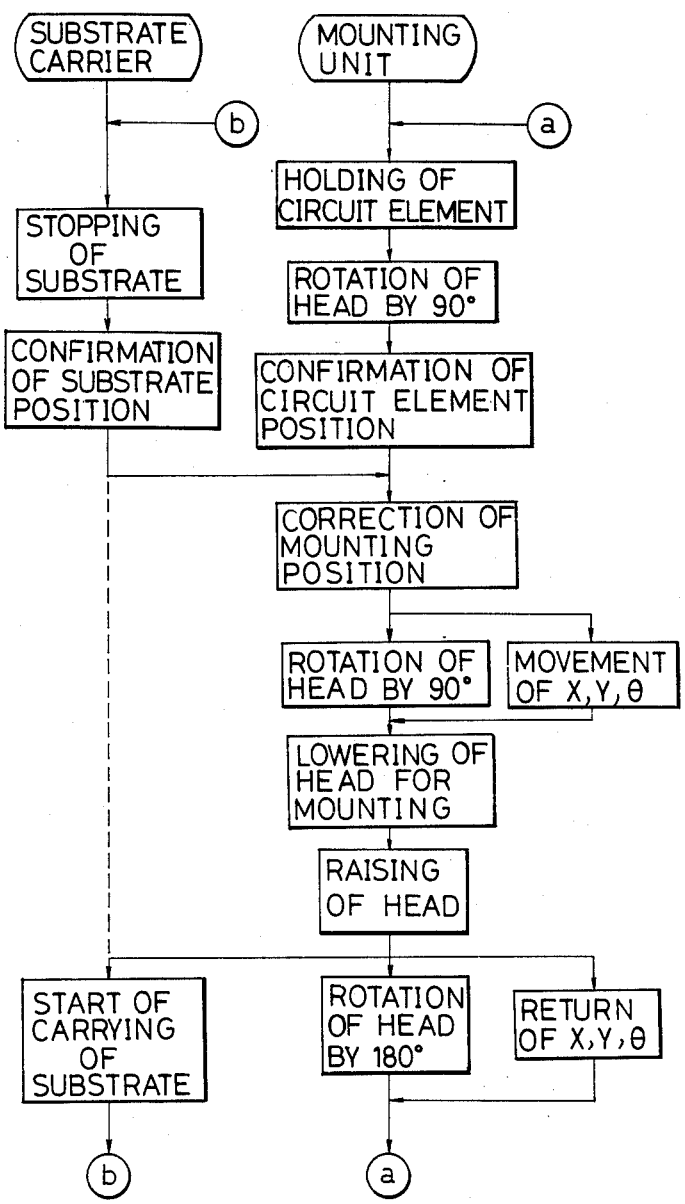
FIG. 4 is a flow chart illustrating the manner of operation of a circuit element mounting system according to the present invention.

The mounting unit 18, to which the positional data has been fed, then carries out the mounting operation according to, for example, procedures a and b shown in FIG. 4. More particularly, the circuit element holding means 50 of the mounting head 20 hold thereon a circuit element designated by the program controller 12 and supplied from the circuit element feed section 46 at position A by suction.

Then, the rotating shaft 52 of the mounting head 20 is rotated by an angle of 90 degrees to cause the circuit element holding means 50 to move to position B, at which the circuit element position reading means 62 (or optical sensor 36) read or detect a circuit element holding state of the holding means 50.

A printed circuit board P carried to the mounting unit 18 by means of the substrate carrier mechanism 48 is stopped and positioned at a predetermined location. The substrate position reading means 54 (or optical sensor 32) judge or detect whether the so-carried printed circuit board P is provided at a circuit element mounting position thereon, with a place or space sufficient for mounting thereon the circuit element held on the circuit element holding means 50.

The position correcting operation circuit 22 judges necessity of correcting positional state of each of the circuit element and printed circuit board in view of outputs of the substrate and circuit element position reading means 54 and 62 and, if required, carries out a calculation for correcting the positional state, so that the mounting head 20 may be positionally controlled to obtain final positional data including corrected values of the X and Y coordinates of the circuit element mounting position, the rotation angle of the circuit element, and the like. The rotating shaft 52 of the mounting head 20 is then rotated by an angle of 90 degrees to cause the circuit element holding means 50 to move to position C, where the holding means are lowered to mount the circuit element on to the printed circuit board P.

Thereafter, the circuit element holding means 50 are raised and then the rotating shaft 52 is further rotated by 180 degrees to cause the holding means 50 to return to position A.

In the illustrated embodiment, positions A, B and C are set at angular intervals of 90 degrees. However, they may be set at any other suitable angular intervals, for example 45 degrees.

As can be seen from the foregoing, the circuit element mounting system of the present invention is so constructed that the mounting head is moved to a predetermined position on a substrate or printed circuit board depending upon circuit element mounting data supplied from the CAD device. Accordingly, the present invention allows the conventional mesh method to be changed to a random method. In the conventional mesh method, the detection and control of a circuit element mounting position are limitedly carried out at the intersections. On the contrary, the present invention causes the mounting of a circuit element to be carried out at any position and in any posture or at any rotation angle θ, with detection and control of the mounting position carried out according to a face control based on a CAD device.

More particularly, according to the present invention, the mounting of a circuit element on a printed circuit board is carried out after confirmation of a place on the board for the circuit element based on the face control, so that duplication of mounting and contact between circuit elements may be effectively eliminated to accomplish mounting with high reliability. Also, the present invention has another advantage that even when dimensions of a circuit element are out of tolerance, any trouble is prevented because the dimensions and location on a printed circuit board on which the circuit element is to be mounted, are detected prior to mounting.

Further, the present invention effectively prevents any mounting error because a location on a printed circuit board on which a circuit element is to be mounted, is previously detected, so that a non-modification method or induction method may be employed which is capable of automatically avoiding mounting error.

In addition, the present invention permits a circuit element mounting position on a printed circuit board to be detected so that the mounting may be carried out through minimum distance.

Furthermore, in the present invention, as described above, the CAD device to which circuit forming conditions such as area of a printed circuit board, types of circuit elements, the number of circuit elements and the like are input according to a circuit diagram, causes a circuit element mounting position to be automatically set on a printed circuit board and the mounting to be started after inspection of mounting procedures, resulting in ultra-high density or concentration mounting being accomplished.

It is thus seen that the objects set forth above, along with those made apparent from the preceding description, are efficiently attained. Moreover, since certain changes may be made in the above construction and operation without departing from the spirit and scope of the present invention, it is intended that all matter contained in the above description or shown in the accompanying drawings shall be interpreted as merely illustrative and not in a limiting sense.

What is claimed is:

1. A circuit element mounting system, comprising;
    a mounting device including a mounting head for holding a circuit element thereon and mounting it on a printed circuit board; and
    a control system for controlling movement of said mounting head to a predetermined position on the printed circuit board depending upon circuit element mounting data input thereto, to cause said mounting head to mount the circuit element on the printed circuit board;
    wherein said mounting head comprises:
    means for holding the circuit element on said mounting head, said circuit element holding means disposed to be intermittently rotatable through a first position, a second position and a third position spaced from one another in consecutive order at angular intervals, and adapted to adjust an angle at which the circuit element is to be mounted on the printed circuit board, said circuit element holding means holding the circuit element thereon at said first position and mounting the circuit element on the printed circuit board at said third position;

means for reading position of the circuit element, said circuit element position reading means being fixed at said second position for detecting a circuit element holding state of said circuit element holding means at said second position; and substrate position reading means for detecting a circuit element mounting position on the printed circuit board at said third position prior to mounting of the circuit element on the printed circuit board by said circuit element holding means.

2. The system of claim 1 wherein said mounting device comprises means for driving the same, and said control system comprises:

a CAD device for generating a first circuit element mounting data depending upon a predetermined circuit forming scheme;

a program controller connected to said CAD device for receiving the first data from said CAD device, said program controller generating positional data necessary for mounting the circuit element on the printed circuit board depending upon the data input from said CAD device;

an operation sequence control section for controlling said drive means of said mounting device, said operation sequence control section being connected to said program controller for receiving the positional data from said program controller;

a position correcting operation circuit connected to said program controller for receiving the positional data therefrom;

a substrate position reading section connected to said position correcting operation circuit, said substrate position reading section judging whether the printed circuit board is provided at the predetermined position thereon, with sufficient space for mounting the circuit element thereon, depending upon data from said substrate position reading means of said mounting head and supplying the judgement to said position correcting operation circuit, a circuit element position reading section connected to said position correcting operation circuit, said circuit element position reading section detecting a circuit element holding state of said circuit element holding means of said mounting head depending upon data from said circuit element position reading means and supplying the detected holding state to said position correcting operation circuit, said position correcting operation circuit judging necessity of correcting said positional data supplied from said program controller in view of the outputs supplied from said substrate position reading section and said circuit element position reading section and correcting the positional data when necessary; and a drive control section connected to said position correcting operation circuit for receiving an output therefrom and connected to said mounting device to control the same depending upon the output.

3. The system of claim 1, wherein the data generated from said CAD includes a circuit element mounting position represented by X and Y coordinates and a circuit element mounting posture represented by a rotation angle.

4. The system of claim 2, wherein said drive means comprise a rotatable shaft on which said mounting head is mounted for rotation.

5. The system of claim 4, wherein said drive means additionally comprise an indexing motor engaged with said rotatable shaft.

6. The system of claim 2, wherein said drive control section additionally comprises
 a first drive control section in the direction of an X-coordinate,
 a second drive control section in the direction of a Y-coordinate, and
 a third rotation angle drive section.

7. The system of claim 6, wherein said mounting device additionally comprises,
 an X-direction drive shaft for moving said mounting head in the X-direction,
 a Y-direction drive shaft for movement said mounting head in the Y-direction, and
 said circuit holding means comprising an angle adjusting shaft for adjusting an angle at which the circuit element is to be mounted upon the printed circuit board,
 said X-direction drive shaft said Y-direction drive shaft, and said angle adjusting shaft controlled respectively by said first, second, and third drive control sections.

8. The system of claim 8, wherein said substrate position reading means are disposed to be rotatable with, and ahead of said circuit element holding means, whereby said substrate position reading means reaches said third position ahead of said circuit element holding means.

9. A method for mounting a circuit element on a printed circuit board, comprising the steps of:
 moving a mounting head holding a circuit element to a predetermined position on a positioned printed circuit board depending upon circuit element mounting data supplied from a CAD device;
 mounting said circuit element on said predetermined position of said printed circuit board by said mounting head depending upon the data from the CAD device;
 detecting if the mounting position of the circuit element on the mounting head corresponds to the data supplied from the CAD device;
 detecting if the circuit board is positioned and has a mounting location for the circuit element corresponding to the data supplied from the CAD device; and
 adjusting the mounting position of the circuit element when the same does not correspond to the CAD supplied data, or when the circuit board position or location does not correspond to the CAD data, prior to mounting the same on said circuit board;
 wherein the circuit element retained on the mounting head is moved through three consecutive positions, with the detection steps and any adjustment steps carried out when the circuit element is at the first two positions, and the mounting step carried out when the circuit element is at the third position.

10. A method for mounting a circuit element on a printed circuit board, comprising the steps of:

moving a mounting head holding a circuit element to a predetermined position on a positioned printed circuit board depending upon circuit element mounting data supplied from a CAD device;

mounting said circuit element on said predetermined position of said printed circuit board by said mounting head depending upon the data from the CAD device;

detecting if the mounting position of the circuit element on the mounting head corresponds to the data supplied from the CAD device;

detecting if the circuit board is positioned and has a mounting location for the circuit element corresponding to the data supplied from the CAD device; and adjusting the mounting position of the circuit element when the same does not correspond to the CAD supplied data, or when the circuit board position or location does not correspond to the CAD data, prior to mounting the same on said circuit board;

wherein the circuit element is moved by the mounting head being rotated, with three positions being set at angular intervals with respect to one another.

11. A circuit element mounting system, comprising:

a mounting device including a mounting head for holding a circuit element thereon and mounting it on a printed circuit board; and a control system for controlling movement of said mounting head to a predetermined position on the printed circuit board depending upon circuit element mounting data input thereto, to cause said mounting head to mount the circuit element on the printed circuit board;

wherein said mounting head comprises:

means for holding the circuit element on said mounting head, said circuit element holding means disposed to be intermittently rotatable through a first position, a second position and a third position spaced from one another in consecutive order at angular intervals, said circuit element holding means holding the circuit element thereon at said first position and mounting the circuit element on the printed circuit board at said third position;

means for reading position of the circuit element, said circuit element position reading means being fixed at said second position for detecting a circuit element holding state of said circuit element holding means at said second position; and substrate position reading means for detecting a circuit element mounting position on the printed circuit board at said third position prior to mounting of the circuit element on the printed circuit board by said circuit element holding means.

* * * * *